May 6, 1969 W. C. MYERS ET AL 3,443,151
ELECTRICAL CONTROL CIRCUITS
Filed Nov. 30, 1965 Sheet 1 of 2

INVENTORS
WILLIAM C. MYERS AND
DAVID L. GRANTEER
BY [signature]
ATTORNEY

INVENTORS
WILLIAM C. MYERS AND
DAVID L. GRANTEER
BY Harold R. Patton
ATTORNEY

United States Patent Office 3,443,151

Patented May 6, 1969

3,443,151

ELECTRICAL CONTROL CIRCUITS

William C. Myers, Ballwin, and David L. Granteer, St. Louis, Mo., assignors to Monsanto Company, St. Louis, Mo., a corporation of Delaware Filed Nov. 30, 1965, Ser. No. 510,639
Int. Cl. H05b *37/02, 39/04, 41/36*
U.S. Cl. 315—169 9 Claims

ABSTRACT OF THE DISCLOSURE

An electrical control circuit for electroluminescent (E.L.) devices including a pair of opposite-conductivity field effect transistors whose source-drain current paths are connected in series with a power supply and the E.L. device. One field effect transistor is of the enhancement type while the other is of the depletion type. The control or gate electrodes of each field effect transistor are connected to a variable control voltage source. The series combination of the two field effect transistors provides a combined peaking current-vs.-voltage transfer characteristic for a predetermined range of control voltages.

The present invention relates generally to electrical control circuits, and more particularly to circuits employing unipolar or, as commonly referred to, field effect transistors to control the supply of electrical energy to utilization devices.

In the design of electronic circuits for switching a power supply to selectively energize utilization devices (for example, an array of electroluminescent cells, electroluminescent phosphorus layers, or a portion thereof), it is desirable to provide a control circuit which exhibits a peaking current or voltage vs. control voltage characteristic. The control circuits are connected to a control signal source and actuated by a sweeping signal of a chosen predetermined magnitude or range of magnitudes. In this manner the particular magnitude of the control signal applied too the several control circuits causes selective actuation of one or more control circuits which in turn permits energization of its attendant utilization device or devices. The other control circuits remain unaffected until the applied sweeping control signal is appropriate for their actuation. By properly selecting the control signals and the control circuit switching components, utilization devices may be constructed to afford a flat, single-axis display device tantamount to a metering instrument, sign display, or the like.

Heretofore the control circuits for electroluminescent cells have utilized ferroelectric materials which present hysteresis and microelectronic fabrication problems. Furthermore, these materials are not readily susceptible to integrated circuit fabrication.

The general purpose of this invention is to provide circuitry for controlling the supply of electrical energy to utilization devices which embraces the advantages of similarly employed circuits but does not possess the afore-described disadvantages. To attain this, the present invention employs two opposite conductivity field effect transistors, one of which operates in the enhancement mode and the other of which operates in the depletion mode to provide accurate control of the energization of the utilization devices.

An object of the present invention is the provision of a unique combination of field effect transistors which exhibits an electrical peaking characteristic.

Another object is to provide a circuit for controlling the supply of electrical energy and adapted to be readily actuated by control voltages of predetermined magnitudes.

A further object of the invention is the provision of a control system for electroluminescent arrays utilizing unipolar transistors which may be fabricated by suitable integrated circuit techniques.

In the present invention these objects (as well as others apparent herein) are achieved generally by providing a pair of opposite conductivity field effect transistors whose source-drain current paths are connected in series with a power supply and a utilization device. One of the field effect transistors is of the enhancement mode type, while the other is of the depletion mode type. Their gate electrodes are connected to a common gating voltage or control source.

In this manner, the field effect transistors serve as a selectively controllable switching circuit having an electrical peaking characteristic.

It should be understood that the term electrical peaking characteristic refers to the characteristic of a material or element or combination of elements, whereby the control of one electrical characteristic varies a second electrical characteristic, the second characteristic having a maximum value at a finite value of the first characteristic and having less than the maximum value at all other values of the first characteristic. As an example of a well known material having an electrical peaking characteristic, consider a chip of ferroelectric barium titanate. The A.C. dielectric constant (second characteristic) varies with the applied electric field (first characteristic) and reaches a maximum, or peak, at zero electric field. On both sides of zero electric field, the dielectric constant is less than the peak value. In the present invention a combination of elements, specifically an enhancement mode FET and a depletion mode FET, exhibits a peak in current at a finite voltage and passes less than the peak current at any other value of voltage. The combination, having the current versus voltage peaking characteristic, may be used as a switch which is actuated only at the aforementioned finite voltage. Furthermore, as will be explained in more detail hereafter, the combination of elements has particular usage in selectively distributing electrical energy to a plurality of utilization devices or to a desired small area in space.

Utilization of the invention will become apparent to those skilled in the art from the disclosures made in the following description of a preferred embodiment of the invention as illustrated in the accompanying drawings, in which.

Figure 1:
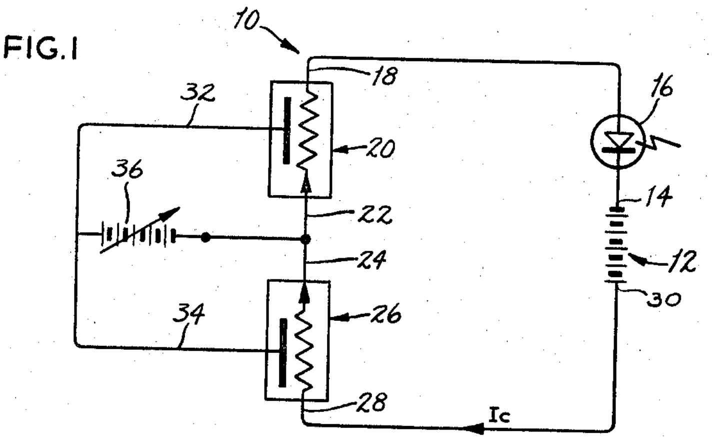
FIG. 1 is a schematic circuit diagram of a simplified control circuit for practicing the present invention.

Referring now to the drawing, wherein like reference characters designate like or corresponding parts throughout the several views, there is shown in FIG. 1 a basic electrical control circuit, generally designated 10, which illustrates the present invention in a simplified form. The drawing shows a D.C. power supply 12 having its negative terminal 14 connected to one terminal of an electroluminescent cell 16 (hereinafter referred to as an E.L. cell) whose other terminal is connected to the drain electrode 18 of a field effect transistor 20. Preferably the E.L. cell 16 is a III–V compound, light emitting diode consisting of two opposite conductivity (P- and N-type) regions which meet at a junction. The E.L. cell 16 is characterized by its ability to emanate visible light from its junction when a current is passed through it. Other utilization devices such as a heater coil, an electroluminescent strip, layer or voltage responsive light emitter may be employed; the diode cell 16 merely being illustrative.

The field effect transistor 20 is similarly a semiconductor device preferably of the conventional MOS type. Often such devices are referred to as unipolar devices because the current flow in the channel consists of either "hole" or "electron" transfer rather than both.

The source electrode 22 of the field effect transistor 20 is connected to the source electrode 24 of a second field effect transistor 26, which may be structurally similar to the field effect transistor 20. The drain electrode 28 of field effect transistor 26 is connected to the positive terminal 30 of the battery 12 to complete the series circuit which includes the E.L. cell 16 and the drain-source current channels of the field effect transistors 20 and 26. The gate electrodes 32 and 34 of the field effect transistors 20 and 26 respectively, are connected to one terminal of a variable control voltage source 36 which, in the illustrative embodiment of FIG. 1, takes the form of a variable D.C. battery. The other terminal of the variable control source battery 36 is connected to the series circuit, just described, at the juncture of the source electrodes 22 and 24.

It should be apparent that the battery 36 serves as a common control voltage source for providing the source-gate bias to each of the field effect transistors 20 and 26. Thus, by forwardly or reversely biasing the source-gate electrodes of the field effect transistors 20 and 26, the conductance of the respective source-drain channels can be selectively varied in the manner now to be described.

As indicated by the conventional "arrowhead" legends on the source electrodes 22 and 24, the channels of the field effect transistors 20 and 26 are of P- and N-type conductivity, respectively. The P-type and N-type field effect transistors 20 and 26 are produced as depletion and enhancement devices respectively. That is, field effect transistor 20 is characterized by its depletion mode of operation; it is normally conducting and continues to conduct at lower and lower levels as a back bias is applied to cut it off. Field effect transistor 26 is characterized by its enhancement mode of operation; it is normally nonconducting and becomes more and more conductive as a forward bias is applied. Depletion and enhancement modes of operation are discussed by L. W. Atwood in the IBM Technical Disclosure Bulletin, "Field Effect Transistor Circuits," vol. 6, No. 9, February 1964.

Figure 2:
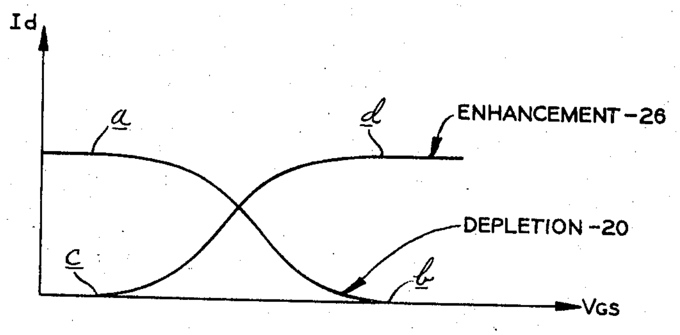
FIG. 2 is a graphical representation of the current vs. voltage characteristics of the field effect transistors of FIG. 1.

The particular field effect transistors 20 and 26 employed in practicing the present invention are chosen to exhibit the characteristic curves shown in FIG. 2. The source-gate bias voltages $V_{SG}$ are plotted along the abscissa axis and the drain currents I*d* are plotted along the ordinate axis. It should be noted that the conductance of transistor 20 operating in the depletion mode decreases from a maximum value at point *a*, its initial condition, to a substantially cut-off value at point *b*. The conductance of transistor 26 operating in the enhancement mode increases from a substantially cut-off value at point *c* to a maximum value at point *d*.

Figure 3:
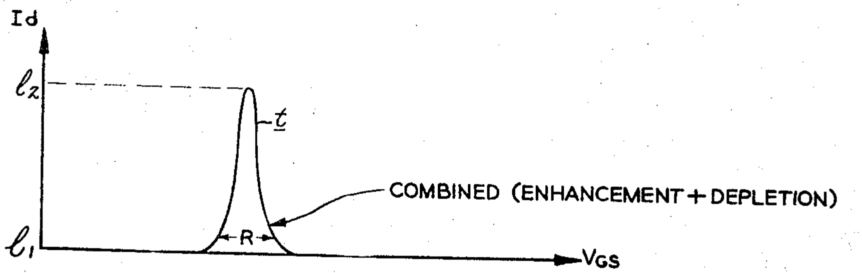
FIG. 3 is a graphical representation of the transfer characteristic of the control circuit comprised of the field effect transistors of FIG. 1.

The resultant transfer function *t* obtained by combining the characteristic curves of FIG. 2 is shown in FIG. 3. For all values of $V_{SG}$, except those falling within the predetermined intermediate range R, the transfer function *t* is at a constant combined current level $l_1$, essentially zero. For values falling within the range R, the transfer characteristic *t* exhibits a peaking characteristic which reaches a maximum current level $l_2$. Thus, it is apparent that the control voltage $V_{SG}$ applied simultaneously to each of the field effect transistors 20 and 26 is effective to provide a combined current $I_c$ in the series circuit which includes the power supply 12 and the utilization E.L. cell 16; this current $I_c$ is sufficient to cause the E.L. cell 16 to emit light in the well known manner.

Control voltage source 36 may be swept through various values to selectively apply different bias voltages $V_{SG}$ to the gate electrodes 32 and 34 of the control transistors 20 and 26. Only when the control voltage $V_{SG}$ falls within the intermediate range R will the field effect transistors 20 and 26 permit sufficient current to flow from the battery 12 to energize the E.L. cell 16; for all other values of control voltage $V_{SG}$ the E.L. cell 16 will remain deenergized.

The opposite conductivity of the transistors 20 and 26 results in majority carrier flow in opposing directions in the two devices. This insures that the peaking characteristic is realized. If like conductivity existed, the characteristic curves of FIG. 2 would be additive rather than opposing and an undesired transfer function would result. It should be apparent, however, that the conductivity of one of the transistors may be changed with a corresponding change made in the other to maintain the combined opposite conductivity characteristic.

Figure 4:
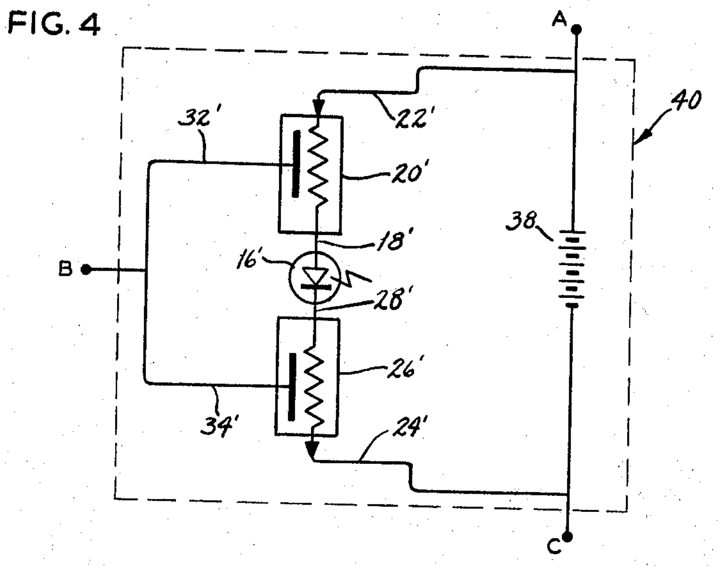
FIG. 4 is a schematic circuit diagram of a modified embodiment of the control circuit of the invention.

Although the circuit 10 of FIG. 1 is useful in selectively energizing the single utilization device 16, it requires a battery 12 for each utilization device. Because this is not practical where many utilization devices are employed, it is desired to modify the circuit 10 so that a point in the control circuit is common with a point in the power supply circuit. Such a circuit 40 is shown in FIG. 4. It employs two field effect transistors 20' and 26' of the depletion and enhancement type which are connected in combination similar to the connection of transistors 20 and 26 of FIG. 1. However, in the circuit of FIG. 4 the source electrodes 22' and 24', instead of being directly connected to each other, are connected to the power supply battery 38 at terminals A and C. The drain electrodes 18' and 28' of the field effect transistors 20' and 26' are connected to the anode and cathode respectively of the E.L. cell 16', while the gate electrodes 32' and 34' are connected together at a terminal, indicated generally as B.

The control circuit 40 is especially adapted for use where the control signal applied to the terminals B and C is a rapidly changing, alternating voltage, such as that required to repetitively sweep many control terminals B. The circuit 40 functions in the same manner as the control circuit 10 of FIG. 1 provided that the characteristics of the field effect transistors 20' and 26' are chosen so as to compensate for the D.C. offset voltage imposed on the source electrodes 22' and 24' by the battery 12'. That is, in the fabrication of the field effect transistors 20' and 26', care is taken to insure that their I*d* vs. $V_{GS}$ characteristics will be brought together as shown in FIG. 2 when connected in circuit with the battery 12' as shown in FIG. 4.

Figure 5:
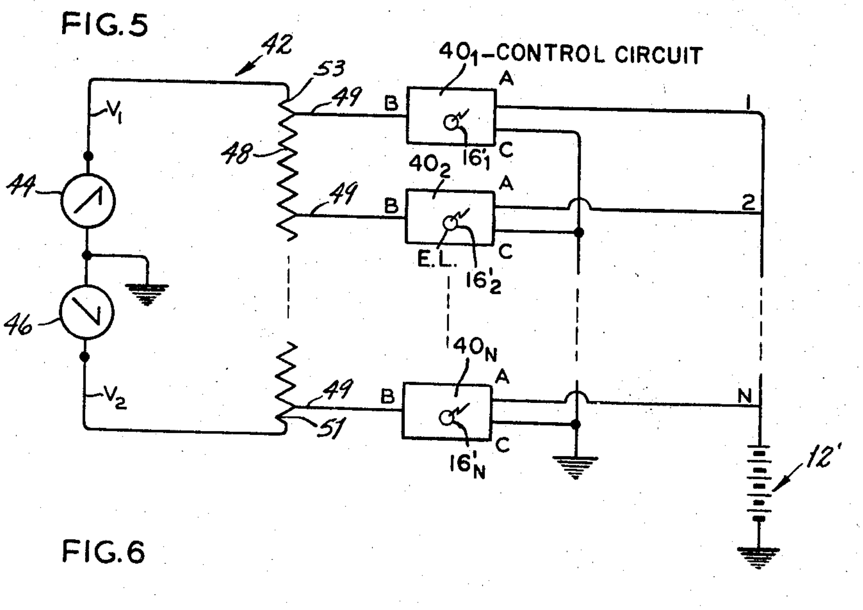
FIG. 5 is a schematic circuit diagram of a single-axis display array utilizing the control circuits of the present invention.

Referring now to FIG. 5, there is shown a single axis display array consisting of N control circuits 40 of the type shown in detail in FIG. 4. However, in FIG. 5 the control circuits $40_1$–$40_N$ are shown as rectangular units, each having the three terminals A, B, and C and a high-emitting electroluminescent device 16'. The terminal junctures A are connected in common to the positive terminal of the power supply battery 12'. The terminals C and the negative terminal of the battery 12' are connected to ground. The terminal junctures B are connected to various pick-off taps 49 of a voltage divider network, generally designated 42.

Figure 6:
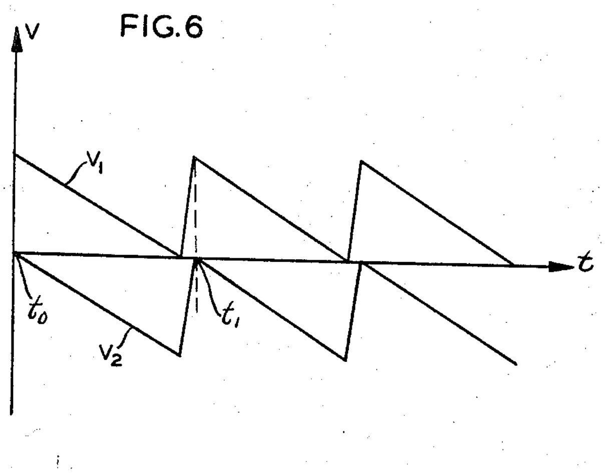
FIG. 6 is a graphical representation of voltage wave forms applied to the circuit of FIG. 5.

The voltage divider network 42 consists of two linear ramp voltage generators 44 and 46 and a resistor 48 having numerous voltage pick-off taps 49 each connected to one of the B terminals of the control circuits 40. In the embodiment illustrated the ramp generators 44 and 46 generate the repetitive complementary ramp signals $V_1$ and $V_2$ as shown in FIG. 6. The ramp signal $V_2$ is applied to the lower end 51 of the voltage pick-off resistor 48 and the ramp signal $V_1$ is applied to its opposite upper end 53. It should be noted from FIG. 6, that at any point of time the ramp signals $V_1$ and $V_2$ establish a constant voltage drop, say 100 volts, across the voltage pick-off resistor 48. The ramp signal $V_1$ decreases from a maximum positive voltage to zero volt, while the ramp voltage $V_2$ increases at the same rate from zero volt to a maximum negative value; the maximum negative value of the ramp signal $V_2$ being equal to the maximum positive value of the ramp signal $V_1$.

The single axis array circuit of FIG. 5 may include any number of control circuits 40 and associated E.L. cells 16'. All of the control circuits 40 may be actuated by the single control voltage divider network 42. For example, assume that the control circuits 40 are designed to exhibit the peaking phenomenon described hereinabove and become actuated by applying a control voltage signal of approximately zero volts to their B terminal. Thus, at time $t_0$, as indicated in FIG. 6, zero volt is applied to the $40_N$ control circuit. As discussed with reference to FIGURES 1, 2 and 3, the application of this control signal will allow current to flow from the battery 12', to the terminal juncture A, through the Nth control circuit 40 (including the field effect transistors 20', 26' and the E.L. cell 16') to ground by way of terminal juncture C. As the ramp voltage $V_1$ decreases and the ramp voltage $V_2$ increases negatively, the control voltage of zero volt is shifted upward along the pick-off resistor 48. This sweeping of the actuating voltage along the resistor 48 sequentially actuates the control circuits 40 from N, N–1 . . . to 1 as it is applied to the resistor pick-off taps 49. Because the control circuits 40 exhibit the peaking characteristic, all voltages other than the control voltage of zero volt are rejected and fail to energize the E.L. cells 16'.

Proper selection of the values for resistor 48 and the ramp voltages $V_1$ and $V_2$ will result in one complete sweeping cycle of the control voltage across the resistor 48. Thus, at time $t_1$ (FIG. 6), the control voltage will have actuated the control circuit $40_1$ indicated as the first or upper circuit in FIG. 6. As the voltages $V_1$ and $V_2$ "fly-back" to their initial values a blanking signal from a blanking generator (not shown) may be applied to the E.L. cells 16' to prevent their energizing during such "fly-back." Subsequent sweeping of the ramp voltages $V_1$ and $V_2$ will sequentially actuate the E.L. cells as their control circuits are switched to allow the current to flow from the battery 12'. The arrays may be designed so that the control circuits 40, instead of all being actuated by the same control voltage, may be actuated by control voltages of different magnitudes, or instead of sweeping the control voltages, they may be selectively applied and maintained for finite intervals of time.

Many modifications and variations of the present invention are possible in view of the above teachings. Therefore, it is to be understood that the invention may be practiced otherwise than as specifically described.

We claim:

1. For use in controlling the supply of electrical power to a utilization device, the electrical circuit comprising
means for supplying electrical energy,
a utilization device connected to receive electrical energy from said supply means,
a plurality of field effect transistors connected in series with said supply means and said utilization device, said field effect transistors being characterized by a combined peaking current vs. voltage transfer characteristic for a predetermined range of voltages, thereby to conduct only when voltages within said predetermined range are applied thereto, and
control voltage source means connected to said plurality of field effect transistors for simultaneously applying control voltages thereto,
whereby the supply of current from said supply means to energize said utilization device is permitted when control voltages of such predetermined range are applied to said transistors.

2. The electrical circuit as defined in claim 1, wherein said transistors are of opposite conductivity, each transistor having drain, source and gate electrodes, said source electrodes of each transistor being connected together and the drain-source circuit of said transistors being electrically connected in series with said supply means and said utilization device.

3. The electrical circuit as defined in claim 2, wherein said control voltage source means includes a first terminal electrically connected to said source electrodes of said field effect transistors and a second terminal electrically connected to said gate electrodes of said field effect transistors,
whereby the supply of current from said supply means to energize said utilization device is permitted when control voltages of a predetermined range are applied to said opposite conductivity field effect transistors.

4. For use in controlling the supply of electrical power to a utilization device, the circuit comprising
a source of electrical energy,
a utilization device connected to receive electrical energy from said source,
a first field effect transistor having drain, source and gate electrodes, said first field effect transistor being biased to operate in the enhancement mode of operation,
a second field effect transistor of opposite conductivity to said first field effect transistor and having drain, source and gate electrodes, the source and drain electrodes of said second field effect transistor being connected in series with said source and drain electrodes of said first field effect transistor, said second field effect transistor being biased to operate in the depletion mode of operation,
the drain-source electrode circuits of said first and second field effect transistors being electrically connected in series with said utilization device and said source of electrical energy, and
a control voltage source including a first terminal connected to said series circuit including said drain-source electrodes of said transistors and a second terminal connected to said gate electrodes thereof,
whereby the supply of current from said supply means to said utilization device is prevented by said opposite conductivity field effect transistors for all control voltages except those of a predetermined range.

5. The electrical circuit as defined in claim 4, wherein the utilization device is connected between said drain electrodes of said first and second field effect transistors, and
the operating level of said first field effect transistor is offset by an amount corresponding to the D.C. potential of said source of electrical energy.

6. For use in controlling the supply of electrical power to a utilization device, the circuit comprising
means for supplying electrical energy,
en electroluminescent cell connected to receive electrical energy from said supply means,
a first unipolar transistor having gate, source and drain electrodes and a conductive channel of a first conductivity type extending between said drain and source electrodes, said conductive channel of said first unipolar transistor being initially biased nonconductive,
a second unipolar transistor having gate, source and drain electrodes and a conductive channel of a conductivity type opposite that of said conductive channel of said first unipolar transistor, said conductive channel of said second unipolar transistor being initially biased conductive and being electrically connected in series with said conductive channel of said first unipolar transistor,
a single control voltage source including a first terminal connected to a terminal included in said series circuit of said conductive channels of said unipolar transistors and a second terminal connected to their respective gate electrodes, said control voltage source being variable to render said conductive channel of said first unipolar transistor progressively more conductive and said conductive channel of said second unipolar transistor correspondingly less conductive, whereby said control voltage source controls the conduction of said unipolar transistor channels to prevent the supply of current from said source of electrical energy to said utilization device except for a predetermined range of control voltages.

7. For use in controlling the supply of electrical power to a single-axis array of utilization devices, the circuit comprising a reference potential, a source of electrical energy having one terminal connected to said reference potential, a plurality of electroluminescent devices supported in a predetermined array, a plurality of field effect transistor pairs, each pair consisting of opposite conductivity transistors and having a combined current vs. voltage transfer characteristic for a predetermined range of voltages, each transistor including gate, source, and drain electrodes, the drain electrode of each pair being electrically connected to at least one of said electroluminescent devices, one source electrode of each pair of transistors connected to the other terminal of said source of electrical energy, and the other source electrode of each pair of transistors connected to said reference potential, whereby the drain-source circuits of each of said transistor pairs is connected in series circuit with at least one of said plurality of electroluminescent devices, variable control voltage source means including a first terminal electrically connected to said reference potential, and a second terminal of said control voltage source means being connected to said gate electrode of each transistor of each field effect transistor pair.

8. For use in controlling the supply of electrical power to utilization devices actuated by a sweeping control voltage, the circuit comprising means for supplying electrical energy, a pair of field effect transistors connected in series with said supply means, said field effect transistors being characterized by a combined peaking current vs. voltage transfer characteristic for a predetermined range of voltages, thereby to conduct only when sweeping voltages within said predetermined range are applied thereto, and control voltage source means connected to said pair of field effect transistors for simultaneously applying control voltages thereto, whereby the supply of electrical energy from said supply means to actuate such utilization device is permitted when control voltages of such predetermined range are applied to said field effect transistors.

9. The control circuit as defined in claim 8, wherein said field effect transistors are of opposite conductivity types, one of said field effect transistors being characterized by a depletion mode of operation and the other of said field effect transistors being characterized by an enhancement mode of operation.

References Cited

UNITED STATES PATENTS 3,254,267 5/1966 Sack ---------------- 315—169

OTHER REFERENCES

Lehman: "Fabrication of Transistors," September 1965, 1 p., IBM Technical Disclosure Bulletin.

Hofstein: "Silicon Insulated Gate FE Transistor," September 1963, 32 pages, pp. 1190–1193 relied on, Procedings of the IEEE, pp.1190–1202.

JOHN W. HUCKERT, *Primary Examiner.*

SIMON BRODER, *Assistant Examiner.*

U.S. Cl. X.R.

307—304; 317—235